United States Patent [19]

New

[11] Patent Number: 5,629,886

[45] Date of Patent: May 13, 1997

[54] METHOD AND STRUCTURE FOR PROVIDING FAST PROPAGATION OF A CARRY SIGNAL IN A FIELD PROGRAMMABLE GATE ARRAY

[75] Inventor: Bernard J. New, Los Gatos, Calif.

[73] Assignee: Xilinx, Inc., San Jose, Calif.

[21] Appl. No.: 494,131

[22] Filed: Jun. 23, 1995

Related U.S. Application Data

[63] Continuation-in-part of Ser. No. 310,113, Sep. 20, 1994, Pat. No. 5,481,206, which is a continuation-in-part of Ser. No. 116,659, Sep. 2, 1993, Pat. No. 5,349,250.

[51] Int. Cl.$^6$ ........................................... G06F 7/50
[52] U.S. Cl. ........................................... 364/787
[58] Field of Search ........................... 367/787, 788

[56] References Cited

U.S. PATENT DOCUMENTS

| | | | |
|---|---|---|---|
| 4,124,899 | 11/1978 | Birkner et al. | 364/716 |
| 4,706,216 | 11/1987 | Carter | 365/94 |
| 4,758,745 | 7/1988 | Elgamal et al. | 307/465 |
| 4,870,302 | 9/1989 | Freeman | 307/465 |
| 5,198,705 | 3/1993 | Galbraith et al. | 307/465 |
| 5,258,668 | 11/1993 | Cliff et al. | 307/465 |
| 5,260,611 | 11/1993 | Cliff et al. | 307/465 |
| 5,267,187 | 11/1993 | Hsieh et al. | 364/784 |
| 5,280,202 | 1/1994 | Chan et al. | 307/465 |
| 5,287,472 | 2/1994 | Horst | 365/189 |
| 5,332,929 | 7/1994 | Chiang | 365/189 |
| 5,349,250 | 9/1994 | New | 307/465 |
| 5,352,940 | 10/1994 | Watson | 365/189 |
| 5,483,478 | 1/1996 | Chiang | 364/787 |
| 5,487,025 | 1/1996 | Partovi et al. | 364/788 |
| 5,508,952 | 4/1996 | Kantabutra | 364/787 |

FOREIGN PATENT DOCUMENTS

0456475A2  11/1991  European Pat. Off. .
0607657A1  7/1994   European Pat. Off. .

OTHER PUBLICATIONS

Xilinx Programmable Gate Array Data Book, 1989, pp. 6–30 through 6–44, available from Xilinx, Inc., 2100 Logic Drive, San Jose, California 95124.

C. Lytle "FLEX Programmable Logic: Largest Density PLD", COMPCON Spring '93, Digest of Papers, Feb. 22–26 1993, IEEE, Computer Society Press, New York, pp. 355–361.

Primary Examiner—David H. Malzahn
Attorney, Agent, or Firm—E. Eric Hoffman, Esq.; Edel M. Young

[57] ABSTRACT

A carry logic circuit for a field programmable gate array (FPGA) which allows a carry input signal to be propagated through the carry logic circuit without passing through a multiplexer of another series connected circuit element. The carry logic circuit uses a function generator of the FPGA to provide a propagate signal in response to first and second input signals provided to the carry logic circuit. Also described are methods for performing a carry logic function in an FPGA.

11 Claims, 5 Drawing Sheets

| $P_i$ | $P_{i+1}$ | $C_{i+2}$ |
|---|---|---|
| x | 0 | 1 |
| 0 | 1 | 2 |
| 1 | 1 | 3 |

METHOD AND STRUCTURE FOR PROVIDING FAST PROPAGATION OF A CARRY SIGNAL IN A FIELD PROGRAMMABLE GATE ARRAY

RELATED APPLICATIONS

The present application is a continuation-in-part of commonly owned, U.S. patent application Ser. No. 08/310,113 entitled "Circuit for Fast Carry and Logic" by Bernard J. New and Kerry M. Pierce, filed on Sep. 20, 1994, now U.S. Pat. No. 5,481,206, hereby incorporated by reference in its entirety, which is a continuation-in-part of commonly owned, U.S. patent application Ser. No. 08/116,659, entitled "Logic Structure and Circuit for Fast Carry", filed Sep. 2, 1993, issued as U.S. Pat. No. 5,349,250 on Sep. 20, 1994, also incorporated by reference in its entirety.

FIELD OF THE INVENTION

The present invention relates to a carry logic structure for use in a field programmable gate array (FPGA).

DISCUSSION OF THE RELATED ART

FPGAs typically use logic circuits to perform various a binary arithmetic function, such as addition. FIG. 1 is a diagram of a typical carry logic circuit 1. Carry logic circuit 1, which includes carry circuitry 2 and sum circuitry 3, receives three input signals $A_i$, $B_i$ and $C_i$ and provides two output signals $S_i$ and $C_{i+1}$. Carry logic circuit 1 can implement various arithmetic operations, including the addition of two digital numbers represented by input signals $A_i$ and $B_i$. When adding input signals $A_i$ and $B_i$, input signal $C_i$ is used as a carry signal which has a digital value which represents the result of the addition of two bits at a previous bit position. Output signal $S_i$ is a digital value which represents the sum of input signals $A_i$, $B_i$ and $C_i$. Output signal $C_{i+1}$ is a digital value corresponding to the carry result of the addition of input signals $A_i$, $B_i$, and $C_i$. Table 1 is a truth table defining an addition operation within carry logic circuit 1.

TABLE 1

| $A_i$ | $B_i$ | $C_i$ | $S_i$ | $C_{i+1}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Logic circuit 1 has been implemented within FPGAs using various logic structures. FIG. 2 is a schematic diagram of a conventional carry logic circuit 10. Input signals $A_i$ and $B_i$ are routed through control logic 12 to a hard-wired exclusive OR gate 14. This circuit is also discussed in U.S. Pat. No. 5,267,187, incorporated herein by reference. The output terminal of exclusive OR gate 14 is coupled to the control terminal of multiplexer 16. Multiplexer 16 receives an input signal (typically either the $A_i$ or $B_i$ signal) on one input terminal. The other input terminal of multiplexer 16 is coupled to receive a carry input signal $C_i$ from a previous carry logic circuit (not shown). The carry signal $C_{i+1}$ routed through multiplexer 16 is provided to a subsequent carry logic circuit (not shown) as a carry input signal $C_i$. Signals $A_i$, $B_i$ and $C_i$ are provided to function generator 18 of the FPGA. In response, function generator 18 generates sum signal $S_i$, which is equal to $A_i$ XOR'ed with $B_i$, XOR'ed with $C_i$.

To provide a circuit which adds digital numbers having a plurality of bits, a plurality of carry logic circuits are typically coupled together in a serial manner, such that the carry signal $C_{i+1}$ provided by each carry logic circuit is propagated to a subsequent carry logic circuit as a carry input signal $C_i$. In carry logic circuit 10, carry signal $C_{i+1}$ is created by routing a signal (either the $A_i$ or $B_i$ input signal or carry input signal $C_i$) through multiplexer 16. Multiplexer 16 delays the propagation of carry signal $C_{i+1}$. For each additional carry logic circuit connected in series, additional carry signal propagation delay is introduced by an additional multiplexer.

It would therefore be desirable to have a carry logic circuit for use in an FPGA which reduces carry signal propagation delay.

SUMMARY

Accordingly, the present invention provides an FPGA having at least one least one carry logic circuit. This carry logic circuit includes a first input lead coupled to receive a first input signal (Ai), a second input lead coupled to receive a second input signal (Bi), a first carry chain lead coupled to receive a first carry chain signal (CAi), a second carry chain lead coupled to receive a second carry chain signal (CBi), a third carry chain lead, a fourth carry chain lead, a carry input lead coupled to receive a carry input signal (Ci), and a local carry input lead for providing a local carry input signal (Ci+1) to a logic forming element of another carry logic circuit.

A programmable function generator of the FPGA is coupled to the first and second input leads. The function generator is programmed to perform an exclusive OR operation. In a particular embodiment, the function generator generates the exclusive OR signal in response to the first and second input signals.

The propagate signal is provided to control a first multiplexer and a second multiplexer. The propagate signal causes the first and second multiplexers to couple the first input lead to the third and fourth carry chain leads, respectively, when and only when the first input value is equal to the second input value. The propagate signal further causes the first multiplexer to couple the first carry chain lead to the third carry chain lead and causes the second multiplexer to connect the second carry chain lead to the fourth carry chain lead when and only when the first input signal is not equal to the second input signal.

The present invention also includes a third multiplexer for coupling either the third carry chain lead or the fourth carry chain lead to the local carry input terminal (Ci+1) in response to said carry input signal (Cin). When more than one carry logic circuit is provided in accordance with the present invention, each carry logic circuit has a multiplexer corresponding to the previously described third multiplexer. In such an embodiment, each of these multiplexers is controlled by the carry input signal, which is supplied to each multiplexer in parallel.

The carry logic signal can also include a carry output lead for transmitting a carry output signal from the carry logic circuit and a carry output signal selection circuit coupled to the carry output lead, the third carry chain lead, the fourth carry chain lead and the carry input lead. In such an embodiment, the carry output selection circuit transmits a signal from either the third or fourth carry chain leads to the carry output lead in response to the carry input signal. The carry input signal is provided to the carry output signal selection circuit and the third multiplexer in parallel. As a result, the carry signal propagation delay is minimized.

The present invention will be more fully understood in light of the following detailed description taken together with the drawings.

DETAILED DESCRIPTION OF THE PREFERRED EMBODIMENTS

Figure 1:
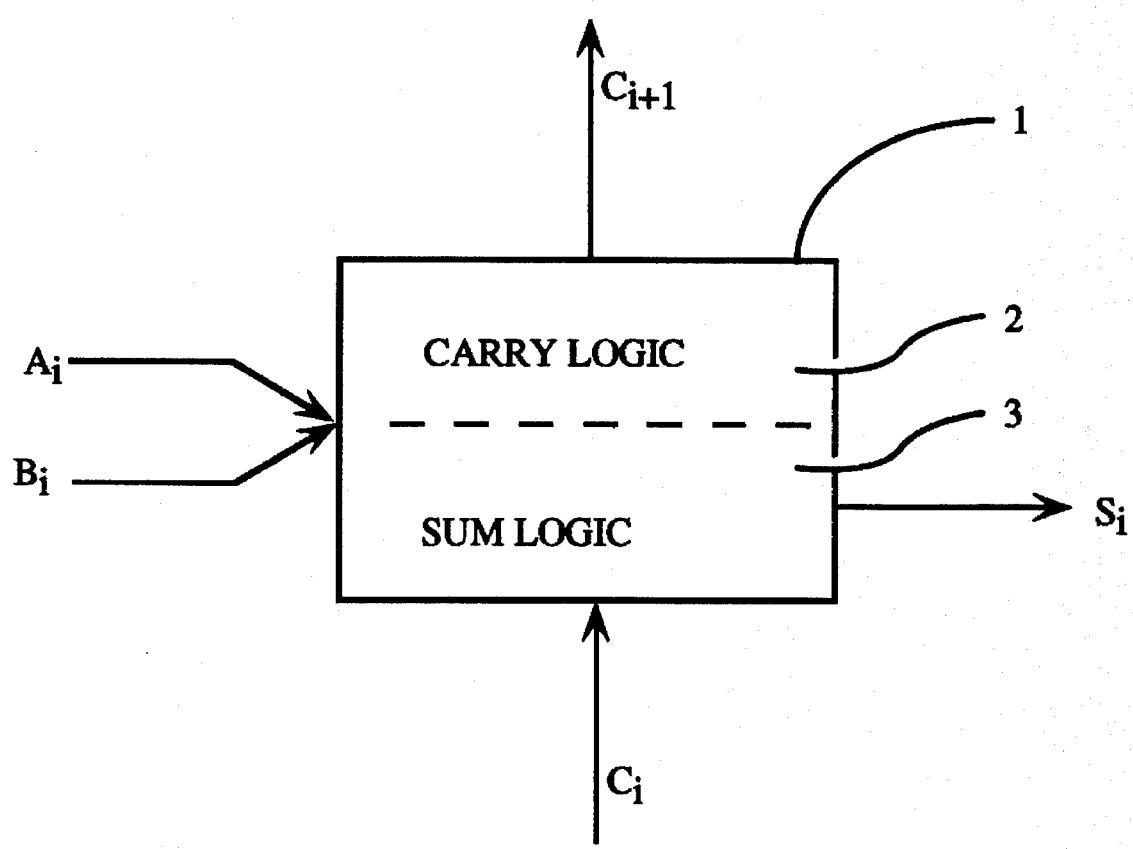
FIGS. 1–2 are schematic diagrams of conventional carry logic circuits.
Figure 2:
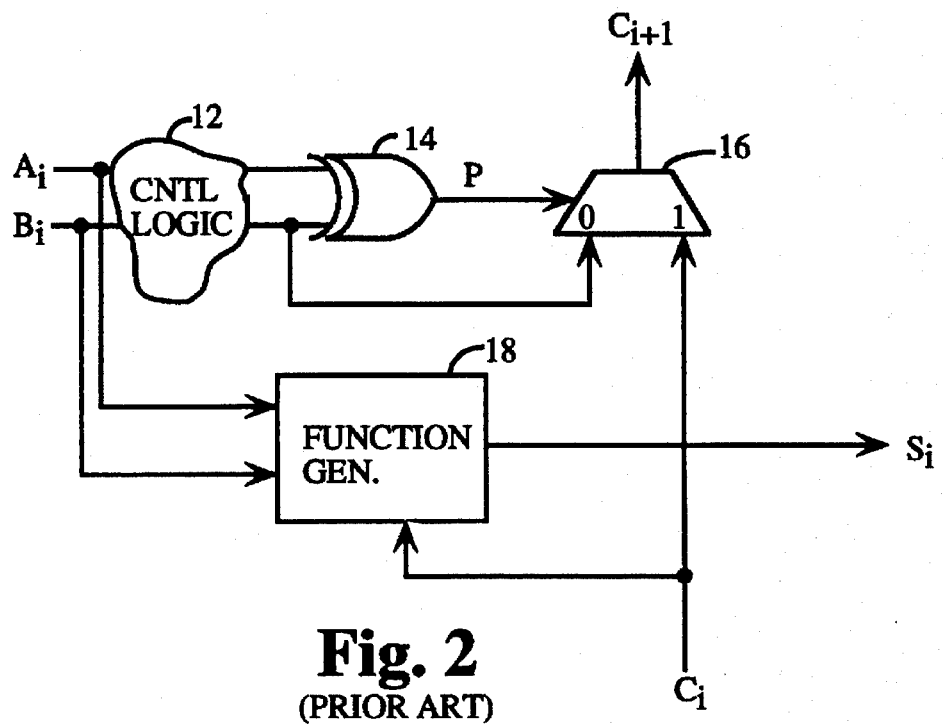
Figure 3:
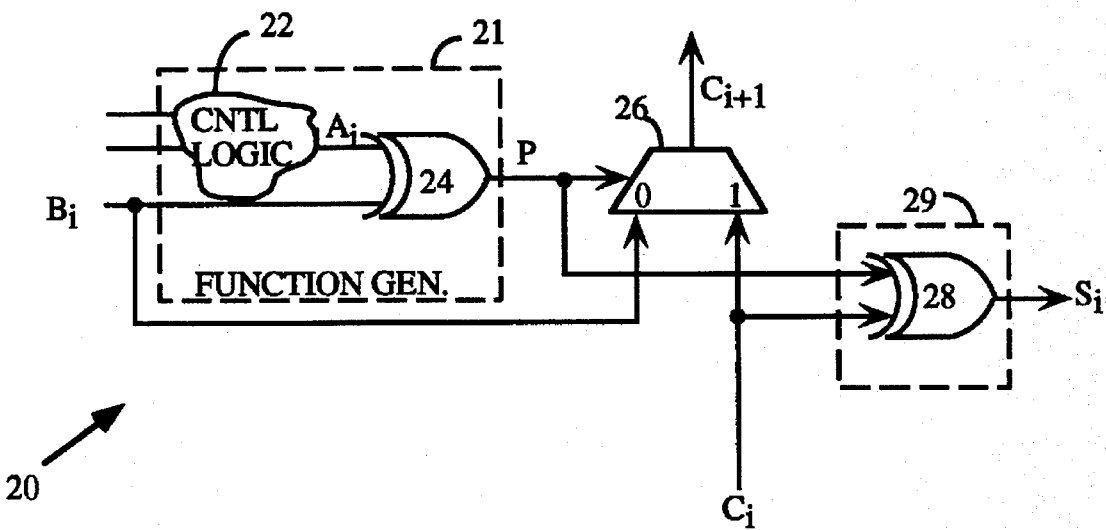
FIGS. 3 and 4 are schematic diagrams of carry logic circuits.

FIG. 3 is a schematic diagram of carry logic circuit 20 for use in an FPGA. Input signals $A_i$ and $B_i$ are provided to function generator 21 of the FPGA. Function generator 21 is programmed to implement control logic 22 and exclusive OR gate 24. The output signal of exclusive OR gate 24 is routed to the control terminal of multiplexer 26 and to an input terminal of exclusive OR gate 28. Exclusive OR gate 28 can be hard-wired (not shown) or implemented by programming another function generator 29. Input signal $B_i$ is provided to one input terminal of multiplexer 26 and carry in signal $C_i$ is provided to the other input terminal of multiplexer 26. The signal routed through multiplexer 26 is provided to a subsequent carry logic circuit (not shown) as carry signal $C_{i+1}$. Carry input signal $C_i$ is also provided to an input terminal of exclusive OR gate 28. In response, exclusive OR gate 28 provides sum signal $S_i$.

Because function generator 29 can be programmed to implement logic functions in addition to an exclusive OR, flexibility is added to carry logic circuit 20. This in turn provides flexibility to an FPGA which uses carry logic circuit 20. However, carry logic circuit 20 does not solve the problem of carry signal propagation delay.

Figure 4:
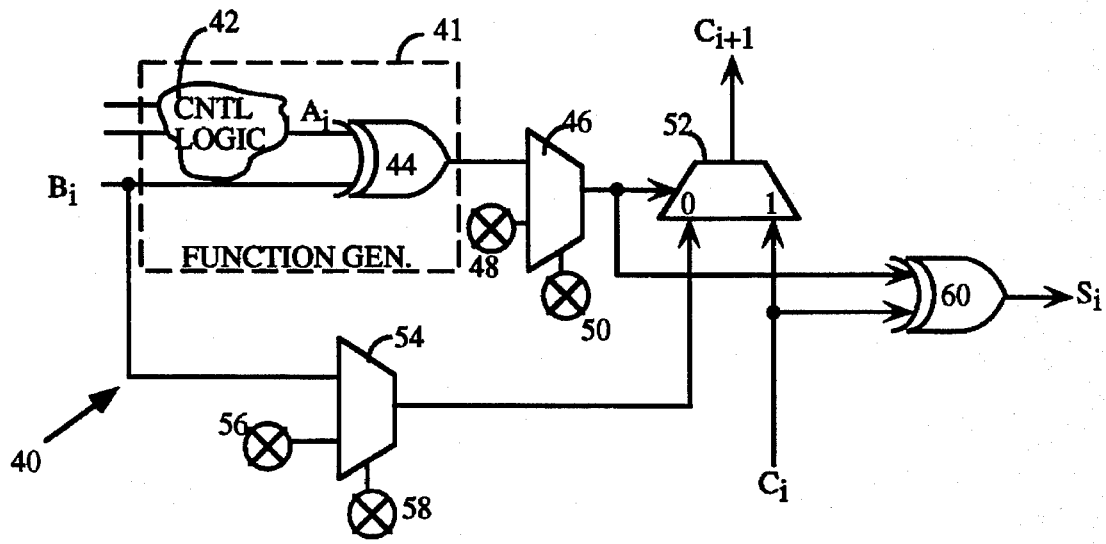

FIG. 4 is a schematic diagram of yet another carry logic circuit 40. Input signals $A_i$ and $B_i$ are provided to function generator 41 which is programmed to implement control logic 42 and exclusive OR gate 44. The output signal of exclusive OR gate 44 is provided to an input terminal of multiplexer 46. The other input terminal of multiplexer 46 is coupled to receive a signal from configurable bit latch 48. Configurable bit latch 48 is programmable to provide a logic high or logic low signal to multiplexer 46. The control terminal of multiplexer 46 is coupled to receive a signal from configurable bit latch 50.

The signal routed through multiplexer 46 is provided to the control terminal of multiplexer 52 and to an input terminal of exclusive OR gate 60. To operate carry logic circuit 40 as an adder circuit in accordance with Table 1, configurable bit latch 50 is programmed to couple exclusive OR gate 44 to the control terminal of multiplexer 52. Carry input signal $C_i$ is provided to the other input terminal of exclusive OR gate 60 and to an input terminal of multiplexer 52. The other input terminal of multiplexer 52 is coupled to multiplexer 54. Multiplexer 54 routes either input signal $B_i$ or a signal generated by configurable bit latch 56. Multiplexer 54 is controlled by a signal generated by configurable bit latch 58. To operate carry logic circuit 40 as an adder circuit in accordance with Table 1, configurable bit latch 58 is programmed to route input signal $B_i$ to multiplexer 52. The carry signal $C_{i+1}$ routed through multiplexer 52 is provided to a subsequent carry logic circuit (not shown) as a carry in signal $C_i$ of the subsequent carry logic circuit. The output signal of exclusive OR gate 60 is transmitted as sum signal $S_i$.

Because multiplexers 46 and 54 can be programmed to route predefined logic signals (provided by configurable bit latches 48 and 56), flexibility is added to carry logic circuit 40. This in turn provides flexibility to an FPGA which uses carry logic circuit 40. However, carry logic circuit 40 does not solve the problem of carry signal propagation delay.

Figure 5:
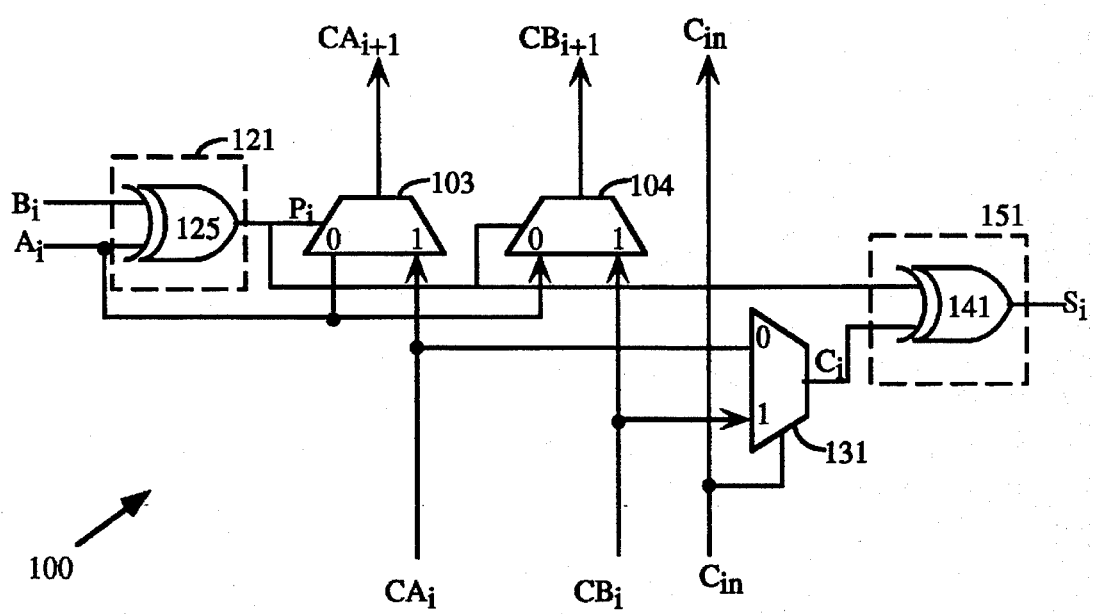
FIG. 5 is a schematic diagram of a carry logic circuit in accordance with one embodiment of the present invention.

FIG. 5 is a schematic diagram of carry logic circuit 100 in accordance with one embodiment of the present invention. Carry logic circuit 100 includes multiplexers 103, 104 and 131, function generators 121 and 151, and exclusive OR gates 125 and 141. Each of multiplexers 103, 104 and 133 has a control terminal, a "0" input terminal, a "1" input terminal and an output terminal. The signal applied to the control terminal determines whether the "0" input terminal or the "1" input terminal is coupled to the output terminal. A logic "0" signal applied to the control terminal causes the "0" input terminal to be coupled to the output terminal, and a logic "1" signal applied to the control terminal causes the "1" input terminal to be coupled to the output terminal.

Input signals $A_i$ and $B_i$, which are typically product terms received from logic forming circuitry of an FPGA, are provided to function generator 121. Function generator 121 is a programmable circuit, such as a look-up table, which is present within a configurable logic block (CLB) of the FPGA. In the embodiment illustrated, function generator 121 is programmed to implement exclusive OR gate 125. The output signal of exclusive OR gate 125 is a propagate signal $P_i$ which is provided to the control terminals of multiplexers 103 and 104 and to an input terminal of exclusive OR gate 141. Exclusive OR gate 141 is implemented by function generator 151 of the FPGA on which carry logic circuit 100 is located. Exclusive OR gate 141 can alternatively be a hard-wired exclusive OR gate.

Input signal $A_i$ is also provided to the "0" input terminals of multiplexers 103 and 104. The "1" input terminals of multiplexers 103 and 104 are connected to receive carry chain signals $CA_i$ and $CB_i$, respectively. The signals transmitted to the output terminals of multiplexers 103 and 104 are labeled as carry chain signals $CA_{i+1}$ and $CB_{i+1}$, respectively.

Carry chain signal $CA_i$ is provided to the "0" input terminal of multiplexer 131, and carry signal $CB_i$ is provided to the "1" input terminal of multiplexer 131. The control terminal of multiplexer 131 is coupled to receive express carry input signal $C_{in}$. The output terminal of multiplexer 131 is coupled to the other input terminal of exclusive OR gate 141. The signal routed from multiplexer 131 to exclusive OR gate 141 is designated as local carry input signal $C_i$. The output signal of exclusive OR gate 141 is designated as sum signal $S_i$.

Express carry input signal $C_{in}$ is transmitted through carry logic circuit 100 without passing through circuit elements, such as multiplexers, which can cause signal delay. As described in more detail below, this feature allows signals to be propagated through carry logic circuit 100 more quickly than in conventional carry logic circuits.

Figures 6, 7:
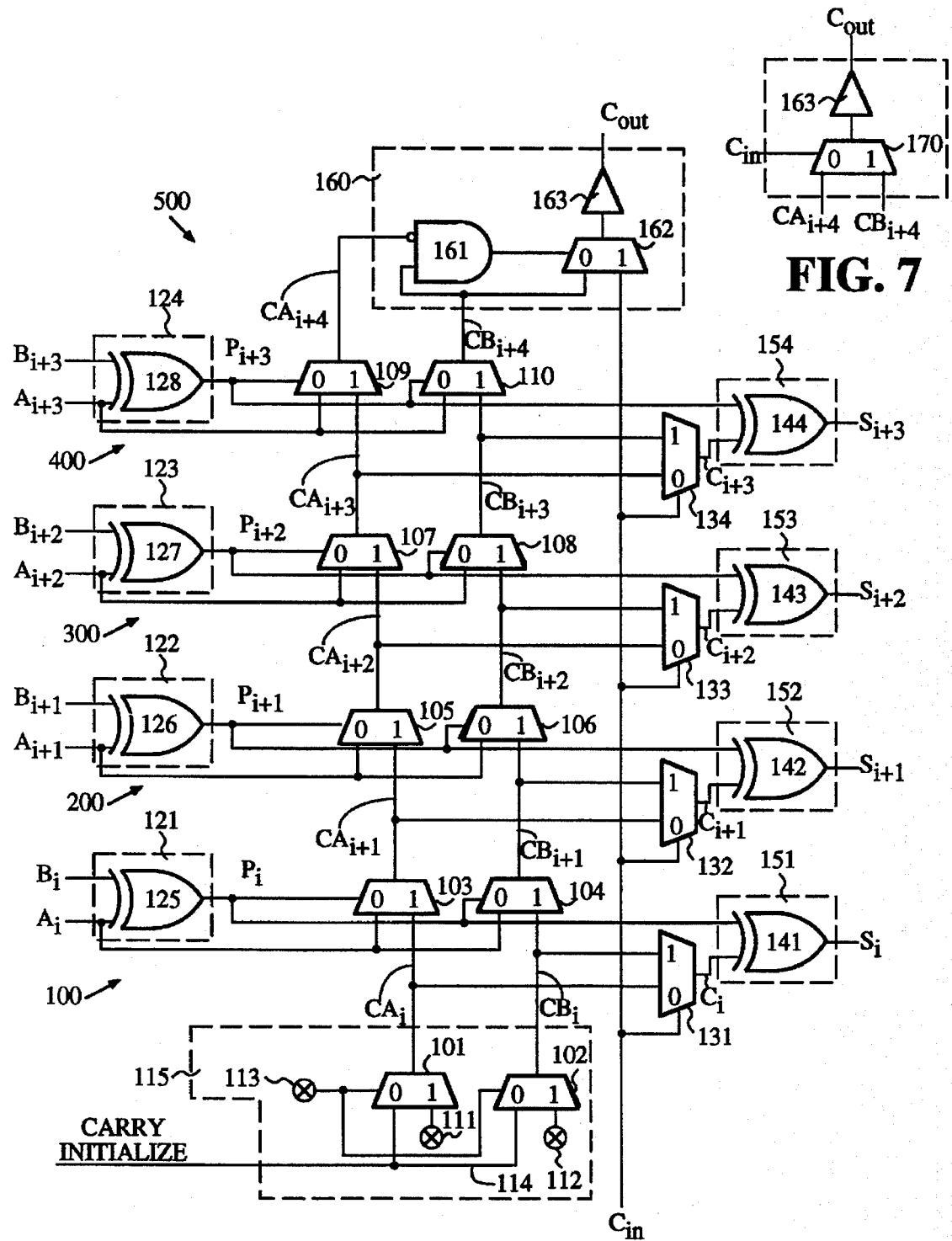
FIG. 6 is a schematic diagram of a 4-bit carry logic structure in accordance with one embodiment of the present invention.
FIG. 7 is a schematic diagram of an optional carry output signal selection circuit.

FIG. 6 is a schematic diagram illustrating a 4-bit carry logic structure 500 which includes four cascaded carry logic circuits 100, 200, 300 and 400. Carry logic circuits 200, 300 and 400 are each identical to carry logic circuit 100 (FIG. 5). Carry logic circuits 200, 300 and 400 include multiplexers 105–110, 132–134, function generators 122–124 and 152–154, and exclusive OR gates 126–128 and 142–144. Carry logic structure 500 also includes carry chain initialization circuit 115 and carry output signal selection circuit 160. Carry chain initialization circuit 115 includes multiplexers 101–102 and configurable bit latches 111–113. Carry output signal selection circuit 160 includes AND gate 161, multiplexer 162 and amplifying buffer 163.

Express carry input signal $C_{in}$ is provided to each of multiplexers 131–134 in parallel. Express carry input signal $C_{in}$ is also provided to carry output signal selection circuit 160. Carry output signal selection circuit 160 is the only series connected circuitry that causes significant delay in the transmission of carry output signal $C_{out}$.

Multiplexers 103, 105, 107 and 109 form a first carry chain through carry logic structure 500 and multiplexers 104, 106, 108 and 110 form a second carry chain through carry logic structure 500. Each carry chain propagates a series of carry chain signals. Thus, the first carry chain propagates carry chain signals $CA_i$, $CA_{i+1}$, $CA_{i+2}$, $CA_{i+3}$, and $CA_{i+4}$ and the second carry chain propagates carry chain signals $CB_i$, $CB_{i+1}$, $CB_{i+2}$, $CB_{i+3}$, and $CB_{i+4}$. Carry chain signals $CA_i$ and $CB_i$ are used to determine local carry signal $C_i$, carry chain signals $CA_{i+1}$ and $CB_{i+1}$ are used to determine local carry signal $C_{i+1}$, carry chain signals $CA_{i+2}$ and $CB_{i+2}$ are used to determine local carry signal $C_{i+2}$, and carry chain signals $CA_{i+3}$ and $CB_{i+3}$ are used to determine local carry signal $C_{i+3}$. Carry chain signals $CA_{i+4}$ and $CB_{i+4}$ are provided to carry output signal selection circuit 160.

Within carry output signal selection circuit 160, carry chain signal $CB_{i+4}$ is provided to the "0" input terminal of multiplexer 162 and express carry input signal $C_{in}$ is provided to the "1" input terminal of multiplexer 162. AND gate 161 is connected to receive carry chain signal $CB_{i+4}$ and the inverse of carry chain signal $CA_{i+4}$. The output terminal of AND gate 161 is connected to the control terminal of multiplexer 162. The output terminal of multiplexer 162 is connected to buffer 163. The output signal of buffer 163 is designated as carry output signal $C_{out}$. Carry output signal $C_{out}$ is provided to a subsequent carry logic structure (not shown) as an express carry input signal (such as express carry input signal $C_{in}$).

Carry logic structure 500 can be programmed to add the four least significant bits of two digital numbers. Alternatively, carry logic structure 500 can be programmed to add four bits other than the four least significant bits of two digital numbers. The programming of carry logic structure 500 is carried out by carry chain initialization circuit 115.

In carry chain initialization circuit 115, the "0" input terminals of multiplexers 101 and 102 are coupled receive a carry initialization signal on line 114. The "1" input terminals of multiplexers 101 and 102 are coupled to receive signals from configurable bit latches 111 and 112, respectively. The control terminals of multiplexers 101 and 102 are coupled to receive a signal from configurable bit latch 113.

When configurable bit latch 113 is programmed to provide a logic "0" signal, the carry initialization signal on line 114 is transmitted through multiplexers 101 and 102 as carry chain signals $CA_i$ and $CB_i$. Thus, carry chain signals $CA_i$ and $CB_i$ are either both set to be logic "0" signals or both set to be logic "1" signals. If carry chain signals $CA_i$ and $CB_i$ are both set to be logic "0" signals, the local carry input signal $C_i$ provided within carry logic circuit 100 is effectively set to a logic "0" value, regardless of the value of the express carry input signal $C_{in}$.

Similarly, if carry chain signals $CA_i$ and $CB_i$ are both set to be logic "1" signals, then the local carry input signal $C_i$ is set to a logic "1" value regardless of the value of express carry input signal $C_{in}$.

When configurable bit latch 113 is programmed to provide a logic "1" signal, the signals programmed in configurable bit latches 111 and 112 are transmitted through multiplexers 101 and 102, respectively, as carry chain signals $CA_i$ and $CB_i$, respectively. In one configuration which uses the carry chain circuit, configurable bit latches 111 and 112 are programmed to provide logic "0" and logic "1" signals, respectively. As a result, the local carry input signal $C_i$ is set to be equal to the value of $C_{in}$. When using carry logic structure 500 to implement an adder circuit, carry chain initialization circuit 115 is not programmed such that configurable bit latches 111 and 112 provide logic "1" and logic "0" signals, respectively, as carry chain signals $CA_i$ and $CB_i$. This is because this combination of signals will cause invalid results within the adder circuit.

To implement the least significant carry logic structure of an adder circuit (i.e., the structure which adds the four least significant bits), configurable bit latch 113 is programmed to provide a logic "0" signal and the carry initialization signal is set to a logic "0" signal. As a result, carry chain signals $CA_i$ and $CB_i$ are each logic "0" signals. This initializes local carry input signal $C_i$ of carry logic circuit 100 to be a logic "0" signal. Table 2 is the truth table for carry logic circuit 100 under these conditions.

TABLE 2

Operation of Carry Logic Circuit 100
$CA_i = 0$, $CB_i = 0$

| $A_i$ | $B_i$ | $C_{in}$ | $P_i$ | $C_i$ | $S_i$ | $CA_{i+1}$ | $CB_{i+1}$ | $C_{i+1}$ |
|---|---|---|---|---|---|---|---|---|
| 0 | 0 | 0 | 0 | 0 | 0 | 0 | 0 | 0 |
| 0 | 0 | 1 | 0 | 0 | 0 | 0 | 0 | 0 |
| 0 | 1 | 0 | 1 | 0 | 1 | 0 | 0 | 0 |
| 0 | 1 | 1 | 1 | 0 | 1 | 0 | 0 | 0 |
| 1 | 0 | 0 | 1 | 0 | 1 | 0 | 0 | 0 |
| 1 | 0 | 1 | 1 | 0 | 1 | 0 | 0 | 0 |
| 1 | 1 | 0 | 0 | 0 | 0 | 1 | 1 | 1 |
| 1 | 1 | 1 | 0 | 0 | 0 | 1 | 1 | 1 |

Thus, carry logic circuit 100 adds input signals $A_i$, $B_i$ and $C_i$ (which is always equal to logic "0") to create sum signal $S_i$ and local carry input signal $C_{i+1}$ in a manner consistent with Table 1. Because both carry chain signals $CA_i$ and $CB_i$ are logic "0" signals, the express carry input signal $C_{in}$ has no effect on the value of sum signal $S_i$ or the value of local carry input signal $C_i$. Moreover, because carry chain signals $CA_{i+1}$ and $CB_{i+1}$ always have the same value, express carry input signal $C_{in}$ has no effect on the value of local carry input signal $C_{i+1}$.

As illustrated in Table 2, when carry chain signals $CA_i$ and $CB_i$ are programmed to logic "0" values, there are only two possible combinations for carry chain signals $CA_{i+1}$ and $CB_{i+1}$. If both of carry chain signals $CA_{i+1}$ and $CB_{i+1}$ have logic "0" values, then carry logic circuit 200 operates in accordance with Table 2. Table 3 illustrates the operation of carry logic circuit 200 if both carry chain signals $CA_{i+1}$ and $CB_{i+1}$ have logic "1" values.

TABLE 3

Operation of Carry Logic Circuit 200
$CA_{i+1} = 1, CB_{i+1} = 1$

| $A_{i+1}$ | $B_{i+1}$ | $C_{in}$ | $P_{i+1}$ | $C_{i+1}$ | $S_{i+1}$ | $CA_{i+2}$ | $CB_{i+2}$ | $C_{i+2}$ |
|---|---|---|---|---|---|---|---|---|
| 0 | 0 | 0 | 0 | 1 | 1 | 0 | 0 | 0 |
| 0 | 0 | 1 | 0 | 1 | 1 | 0 | 0 | 0 |
| 0 | 1 | 0 | 1 | 1 | 0 | 1 | 1 | 1 |
| 0 | 1 | 1 | 1 | 1 | 0 | 1 | 1 | 1 |
| 1 | 0 | 0 | 1 | 1 | 0 | 1 | 1 | 1 |
| 1 | 0 | 1 | 1 | 1 | 0 | 1 | 1 | 1 |
| 1 | 1 | 0 | 0 | 1 | 1 | 1 | 1 | 1 |
| 1 | 1 | 1 | 0 | 1 | 1 | 1 | 1 | 1 |

Thus, carry logic circuit 200 adds input signals $A_{i+1}$, $B_{i+1}$ and $C_{i+1}$ (with $C_{i+1}$ being set to logic "1") to create sum signal $S_{i+1}$ and local carry input signal $C_{i+2}$ in a manner consistent with Table 1. Because both carry chain signals $CA_{i+1}$ and $CB_{i+1}$ are logic "1" signals, the express carry input signal $C_{in}$ has no effect on the value of sum signal $S_{i+1}$ or the value of local carry input signal $C_{i+1}$. Moreover, because carry chain signals $CA_{i+2}$ and $CB_{i+2}$ always have the same value, express carry input signal $C_{in}$ has no effect on the value of local carry input signal $C_{i+2}$.

By initializing the carry chain signals $CA_i$ and $CB_i$ to logic "0" signals, the pairs of carry chain signals which propagate between carry logic circuits in carry logic structure 500 are matched. That is, carry chain signals $CA_{i+1}$ and $CB_{1+1}$ have the same logic value, carry chain signals $CA_{i+2}$ and $CB_{1+2}$ have the same logic value, and carry chain signals $CA_{i+3}$ and $CB_{i+3}$ have the same logic value. As a result, the logic value of express carry input signal $C_{in}$ has no effect on local carry input signals $C_i$, $C_{i+1}$, $C_{i+2}$ and $C_{i+3}$.

If the carry chain signals $CA_i$ and $CB_i$ are initialized to both be logic "1" signals, local carry input signal $C_i$ is set to a logic one value. In this case, carry logic structure 500 is programmed to add a "1" value to the sum of the four bit numbers applied to structure 500.

To implement a structure which adds four bits which are not the four least significant bits of an adder circuit (e.g., the second carry logic structure of an 8-bit adder circuit), configurable bit latch 111 is programmed to provide a logic "0" signal, configurable bit latch 112 is programmed to provide a logic "1" signal and configurable bit latch 113 is programmed to provide a logic "1" signal. This effectively selects carry chain signal $CA_i$ to be a logic "0" signal and carry chain signal $CB_i$ to be a logic "1" signal. Table 4 describes the operation of carry logic circuit 100 under these conditions.

TABLE 4

Operation of Carry Logic Circuit 100
$CA_i = 0, CB_i = 1$

| $A_i$ | $B_i$ | $C_{in}$ | $P_i$ | $C_i$ | $S_i$ | $CA_{i+1}$ | $CB_{i+1}$ | $C_{i+1}$ |
|---|---|---|---|---|---|---|---|---|
| 0 | 0 | 0 | 0 | 0 | 0 | 0 | 0 | 0 |
| 0 | 0 | 1 | 0 | 1 | 1 | 0 | 0 | 0 |
| 0 | 1 | 0 | 1 | 0 | 1 | 0 | 1 | 0 |
| 0 | 1 | 1 | 1 | 1 | 0 | 0 | 1 | 1 |
| 1 | 0 | 0 | 1 | 0 | 1 | 0 | 1 | 0 |
| 1 | 0 | 1 | 1 | 1 | 0 | 0 | 1 | 1 |
| 1 | 1 | 0 | 0 | 0 | 0 | 1 | 1 | 1 |
| 1 | 1 | 1 | 0 | 1 | 1 | 1 | 1 | 1 |

Thus, carry logic circuit 100 adds input signals $A_i$, $B_i$ and $C_i$ to create sum signal $S_i$ and local carry input signal $C_{i+1}$ in a manner consistent with Table 1. Carry logic circuit 200 can receive any one of three possible combinations of carry chain signals $CA_{i+1}$ and $CB_{i+1}$. If both of carry chain signals $CA_{i+1}$ and $CB_{i+1}$ have logic "0" values, then carry logic circuit 200 operates in accordance with Table 2. If both of carry chain signals $CA_{1+1}$ and $CB_{1+1}$ have logic "1" values, then carry logic circuit 200 operates in accordance with Table 3. If carry chain signal $CA_{i+1}=0$ and carry chain signal $CB_{i+1}=1$, then carry logic circuit 200 operates in accordance with Table 4. Carry logic circuits 300 and 400 operate in the same manner as carry logic circuit 200.

Carry output signal selection circuit 160 effectively routes carry chain signal $CA_{i+4}$ as carry output signal $C_{out}$ if express carry input signal $C_{in}$ has a logic "0" value, and routes carry chain signal $CB_{i+4}$ as carry output signal $C_{out}$ if express carry input signal $C_{in}$ has a logic "1" value. Proper operation of carry output signal selection circuit 160 requires that the carry input signals $CA_i$ and $CB_i$ are not selected to be logic "1" and logic "0" signals, respectively.

FIG. 7 illustrates a multiplexer 170 which is logically equivalent to carry output signal selection circuit 160. Multiplexer 170 has a "0" input terminal coupled to receive carry chain signal $CA_{i+4}$, a "1" input terminal coupled to receive carry chain signal $CB_{i+4}$, a control terminal coupled to receive express carry input signal $C_{in}$, and an output terminal which receives carry output signal $C_{out}$. Although carry output signal selection circuit 160 is logically equivalent to multiplexer 170, carry output signal selection circuit 160 transmits carry output signal $C_{out}$ with less delay. This is because express carry input signal $C_{in}$ is not used to control multiplexer 162 in carry output signal selection circuit 160.

When a plurality of 4-bit carry logic structures are cascaded together, the carry signal delay is calculated as follows. In the initial carry logic structure, there is a slight delay introduced as the input signals are routed through the exclusive OR gates to create the propagate signals. There is also one pass gate delay per bit. This is because for each bit, a pair of carry chain signals must pass through a pair of parallel multiplexers, such as multiplexers 103 and 104. In addition, within carry output signal selection circuit 160, there is a slight delay introduced by AND gate 161 and buffer 163, and one pass gate delay introduced by circuit multiplexer 162. However, in each additional carry logic structure, the carry signal delay is equal to the pass gate delay introduced by circuit 162 and the delay introduced by buffer 163. This is because the multiplexers in the carry chains of each of the coupled carry logic structures settle concurrently. By the time that the initial carry logic structure transmits the carry output signal $C_{out}$ to a subsequent carry logic structure, the multiplexers of the subsequent carry logic structure have settled. Consequently, the multiplexers of the carry chain of the subsequent carry logic structure do not significantly contribute to carry signal delay.

Consequently, carry logic structure 500 is capable of performing as a conventional adder circuit, while providing reduced propagation delay for the carry output signal $C_{out}$.

Figure 8:
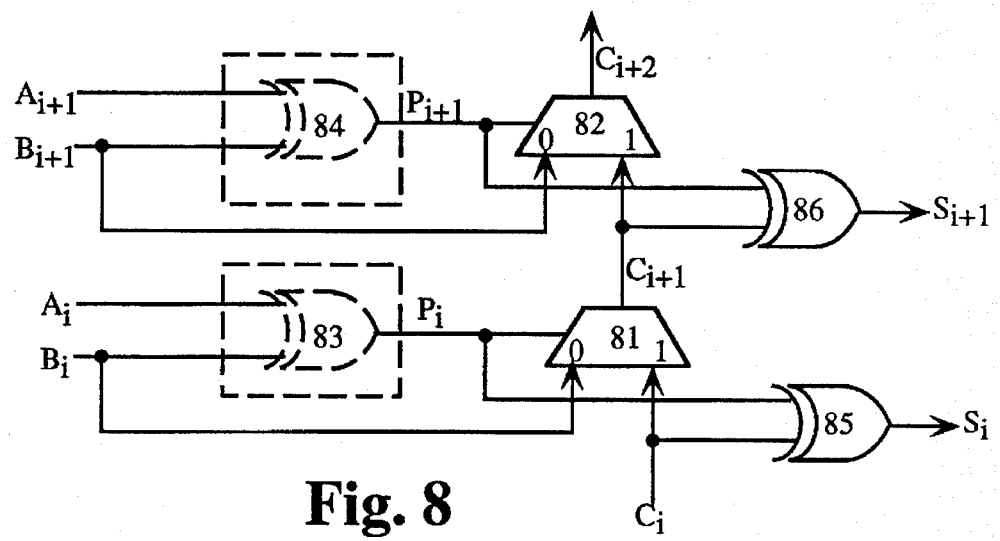
FIGS. 8–10 show schematic diagrams of alternative embodiments of the carry out circuit of the invention.
Figure 9:
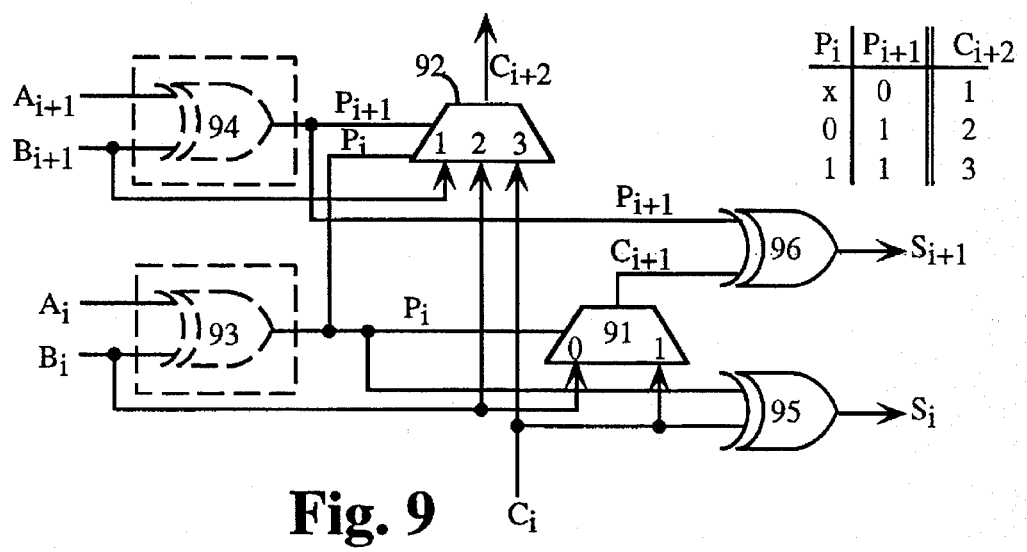
Figure 10:
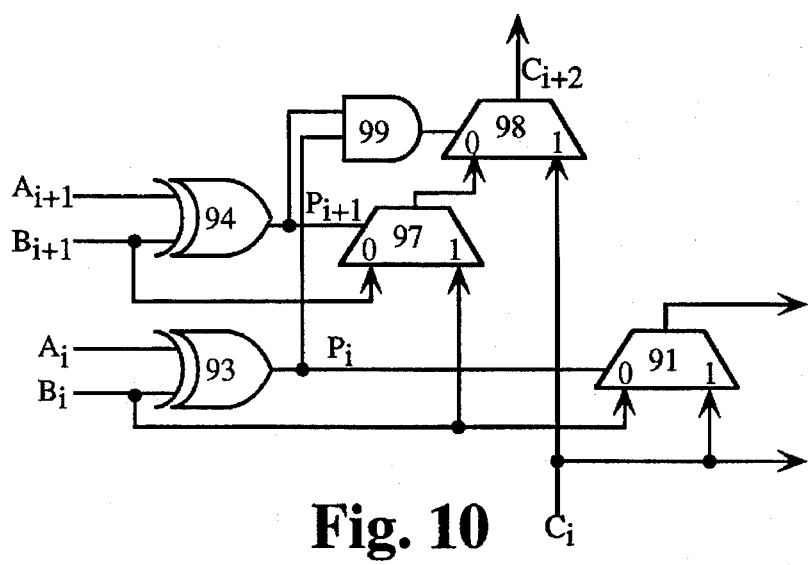

FIGS. 8–10 show schematic diagrams of alternative embodiments of the carry out circuit of the invention. The structure of FIG. 8 is similar to two stages of the structure of FIG. 3, except that the $A_i$ and $A_i$ inputs are shown as separate signals and XOR gates 85 and 86 are shown as being provided in hardware.

FIG. 9 shows the logic reorganized for higher speed. Multiplexer 91, equivalent to multiplexer 81 of FIG. 8 is retained and is used to generate the sum signal in XOR gate 96. However, multiplexer 92 is a three-input multiplexer controlled as shown in the truth table at the right of FIG. 9 by the $P_i$ and $P_{i+1}$ signals, and thus the carry chain delay of multiplexer 91 (or 81 in FIG. 8) is avoided.

The structure of FIG. 10 includes multiplexer 97, which selects between $B_i$ and $B_{i+1}$ as controlled by $P_{i+1}$ to provide an input to two-input multiplexer 98. Also included is AND gate 99, which causes multiplexer 98 to to provide the output of multiplexer 97 only when Pi and $P_{i+1}$ are both logical 1. Thus in FIG. 10, the carry chain signal encounters the delay of only one two-input multiplexer for two stages. (Two-input multiplexers are typically faster than three-input multiplexers.)

Although the invention has been described in connection with several embodiments, it is understood that this invention is not limited to the embodiments disclosed, but is capable of various modifications which would be apparent to one of ordinary skill in the art. For example, carry logic structures having numbers of bits other than four are contemplated. Thus, the invention is limited only by the following claims.

What is claimed is:

1. A field programmable gate array having at least one carry logic circuit comprising:
   a first carry chain which propagates a first plurality of carry chain signals;
   a second carry chain which propagates a second plurality of carry chain signals;
   a first line coupled to receive a carry input signal;
   a plurality of multiplexers, each having a first input terminal coupled to the first carry chain, a second input terminal coupled to the second carry chain, a control terminal coupled to the first line, and an output terminal which receives one of the first plurality of carry signals or one of the second plurality of carry signals in response to the carry input signal on the first line; and
   a plurality of programmable function generators coupled to the first and second carry chains, wherein the function generators control the propagation of the first and second plurality of carry chain signals is through the first and second carry chains.

2. The FPGA of claim 1, further comprising an initialization means for initializing the carry chain signals provided to the first and second carry chains.

3. The FPGA of claim 1 further comprising a signal selection means for selecting a carry output signal from one of the first and second plurality of carry chain signals in response to the carry input signal
   a selection circuit coupled to the first line and the first and second carry chains, wherein the selection circuit transmits one of the first and second plurality of carry signals in response to the carry input signal.

4. A method of performing a carry logic function in a field programmable gate array (FPGA), comprising the steps of:
   providing first and second input signals to a function generator to create a propagate signal;
   providing the propagate signal to control a first multiplexer and a second multiplexer;
   providing a first carry chain signal to the first multiplexer;
   providing a second carry chain signal to the second multiplexer;
   if the first input signal has the same value as the second input signal, then routing the first input signal through the first multiplexer as a third carry chain signal and routing the first input signal through the second multiplexer as a fourth carry chain signal;
   if the first input signal does not have the same value as the second input signal, then routing the first carry chain signal through the first multiplexer as the third carry chain signal and routing the second carry chain signal through the second multiplexer as the fourth carry chain signal;
   providing a carry input signal to control a third multiplexer;
   routing the third carry chain signal through the third multiplexer as a local carry input signal if the carry input signal has a first value; and
   routing the fourth carry chain signal through the third multiplexer as the local carry input signal if the carry input signal has a second value.

5. A field programmable gate array (FPGA) having at least one least one carry logic circuit comprising:
   means for providing a first input signal (Ai);
   means for providing a second input signal (Bi);
   a first carry chain lead coupled to receive a first carry chain signal (CAi);
   a second carry chain lead coupled to receive a second carry chain signal (CBi);
   a third carry chain lead;
   a fourth carry chain lead;
   a carry input lead coupled to receive a carry input signal (Cin);
   a local carry input lead for providing a local carry input signal (Ci+1) to a logic forming element of another carry logic circuit;
   a first multiplexer (103) for connecting one of said first input lead and said first carry chain lead to said third carry chain lead;
   a second multiplexer (104) for connecting one of said first input lead and said second carry chain lead to said fourth carry chain lead;
   a function generator coupled to the first and second input leads, wherein the function generator generates a propagate signal which is provided to said first and second multiplexers, thereby causing said first and second multiplexers to connect said first input lead to said third and fourth carry chain leads when and only when said first input value is equal to said second input value, and to connect said first carry chain lead to said third carry chain lead and to connect said second carry chain lead to said fourth carry chain lead when and only when said first input signal is not equal to said second input signal; and
   a third multiplexer (132) for coupling one of said third carry chain lead and said fourth carry chain lead to the local carry input terminal (Ci+1) in response to said carry input signal (Cin).

6. The FPGA of claim 5, wherein the carry logic circuit further comprises:
   a carry output lead for transmitting a carry output signal from the carry logic circuit;
   a carry output signal selection circuit coupled to the carry output lead, the third carry chain lead, the fourth carry chain lead and the carry input lead, wherein the carry output selection circuit transmits a signal on one of the third and fourth carry chain leads to the carry output lead in response to the carry input signal.

7. The FPGA of claim 6, wherein the carry output signal selection circuit comprises:
   an inverter coupled to the third carry chain lead;
   a logic gate having a first input terminal coupled to the inverter and a second input terminal coupled to the fourth carry chain lead;

a multiplexer having a first input terminal coupled to the fourth carry chain lead, a second input terminal coupled to the carry input lead and a control terminal coupled to the logic gate.

8. The FPGA of claim 7, wherein the logic gate is an AND gate.

9. The FPGA of claim 7, wherein the carry output signal selection circuit further comprises a buffer coupled to the carry output lead.

10. The FPGA of claim 5, wherein the carry logic circuit further comprises:

a carry chain signal initialization circuit for initializing and generating the first and second carry chain signals.

11. The FPGA of claim 10, wherein the carry chain initialization circuit comprises:

a fourth multiplexer having an first input terminal coupled to receive an initializing signal, a second input terminal coupled to a first programmable latch, a control terminal coupled to a second programmable latch and an output terminal coupled to the first carry chain lead; and a fifth multiplexer having an first input terminal coupled to receive the initializing signal, a second input terminal coupled to a third programmable latch, a control terminal coupled to the second programmable latch and an output terminal coupled to the second carry chain lead.

* * * * *

UNITED STATES PATENT AND TRADEMARK OFFICE
CERTIFICATE OF CORRECTION

PATENT NO. : 5,629,886

DATED : May 13, 1997

INVENTOR(S) : Bernard J. New

It is certified that error appears in the above-identified patent and that said Letters Patent is hereby corrected as shown below:

Col. 2, line 23, "least one least one carry" should read --least one carry--.

Col. 7, line 31, "$CB_{1+1}$" should read --$CB_{i+1}$--.

Col. 7, line 32, "$CB_{1+2}$" should read --$CB_{i+2}$--.

Col. 8, line 6, "$CA_{1+1}$ and $CB_{1+1}$" should read --$CA_{i+1}$ and $CB_{i+1}$--.

Col. 10, line 15, "one least one carry" should read --one carry--.

Signed and Sealed this

Twelfth Day of May, 1998

Attest:

BRUCE LEHMAN

*Attesting Officer*  *Commissioner of Patents and Trademarks*